United States Patent [19]
Feye-Hohmann

[11] Patent Number: 6,033,264
[45] Date of Patent: Mar. 7, 2000

[54] ELECTRICAL OR ELECTRONIC DEVICE FOR SEATING ON A MOUNTING RAIL AND PROCESS FOR PRODUCING SAME

[75] Inventor: Jörgen Feye-Hohmann, Darmold, Germany

[73] Assignee: Phoenix Contact GmbH & Co., Blomberg, Germany

[21] Appl. No.: 09/073,644

[22] Filed: May 6, 1998

[30] Foreign Application Priority Data

May 6, 1997 [DE] Germany ............................ 197 18 996

[51] Int. Cl.$^7$ .................................................. H01R 23/70
[52] U.S. Cl. ............................................ 439/631; 439/928
[58] Field of Search ................................... 439/631, 715, 439/716, 928, 651, 653, 884

[56] References Cited

U.S. PATENT DOCUMENTS

| | | | |
|---|---|---|---|
| 4,322,120 | 3/1982 | Rilling | 439/631 |
| 5,716,241 | 1/1995 | Hennemann | 439/716 |

FOREIGN PATENT DOCUMENTS

| | | |
|---|---|---|
| 0 364 618 | 4/1990 | European Pat. Off. . |
| 34 36 119 | 4/1986 | Germany . |
| 32 15 054 | 4/1990 | Germany . |
| 41 40 611 | 5/1993 | Germany . |
| 43 10 369 | 8/1995 | Germany . |
| 295 14 711 | 12/1995 | Germany . |
| 43 24 061 | 4/1996 | Germany . |

*Primary Examiner*—Renee S. Luebke
*Assistant Examiner*—Javaid Nasri
*Attorney, Agent, or Firm*—Sixbey, Friedman, Leedom & Ferguson; David S. Safran

[57] ABSTRACT

The invention relates to electrical or electronic device (1) for seating on a mounting rail (2), with a housing (3), at least one circuit board (4) located in the housing (3), and with at least one contact arrangement (6) having a contact (8) for making contact with the circuit board (4), and front and rear bus contacts for a data and/or power bus connection to adjacent devices (1) which have corresponding contact arrangements (6) and which are seated on the mounting rail (2). To be able to the produce contact arrangement (6) of the device (1) easily and quickly, the circuit board contact (8), the front bus contact (9) and the rear bus contact (10) are produced from the same continuous piece of electrically conductive material.

9 Claims, 4 Drawing Sheets

ELECTRICAL OR ELECTRONIC DEVICE FOR SEATING ON A MOUNTING RAIL AND PROCESS FOR PRODUCING SAME

BACKGROUND OF THE INVENTION

1. Field of the Invention

The invention relates to an electrical or electronic device for seating on a mounting rail, with a housing, with at least one circuit board located in the housing, and with at least one contact arrangement which, on the one hand, makes contact with the circuit board, and on the other hand, provides a data and/or power bus connection with adjacent devices which have corresponding contact arrangements and which are seated on the mounting rail, the contact arrangement having a circuit board contact, a front bus contact and a rear bus contact. Furthermore, the invention relates to a process for producing a contact arrangement for an electrical or electronic device, especially of the aforementioned type.

2. Description of Related Art

An electrical or electronic device of the initially mentioned type is already known from practice. In the known device, which has a plurality of contact means for the data and/or power bus connection, each individual contact means consists of a plurality of individual parts which are joined to one another to be electrically conductive via a riveted or welded connection. Production of the known contact means takes place such that the individual contact tips of the contact are first punched out and bent accordingly, then moved into the correspondingly required arrangement relative to one another, and finally are connected to one another via the indicated connection. This type of production of the known contact means is associated with relatively high cost.

SUMMARY OF THE INVENTION

The primary object of this invention is to make available a contact means for an electrical or electronic device of the initially mentioned type which can be easily and economically produced.

This object is achieved in an electrical or electronic device of the aforementioned type or in a process for producing a contact means for a device of the aforementioned type by the circuit board contact, the front bus contact and the rear bus contact being produced from a continuous piece of electrically conductive material. The invention makes it possible to easily and quickly produce the contact means by a single punching process and some subsequent bending, and if necessary, other machining steps. Because the contact means is a single piece, the necessary connection of the individual contacts is eliminated; this had been necessary in the prior art.

The specific configuration of the individual contacts of the contact means advantageously is such that the circuit board contact is made as a tulip-like contact receiver with two contact legs which open to the outside, while the circuit board is located roughly transversely to the longitudinal direction of the mounting rail. This design of the circuit board contact enables simple insertion of the circuit board into the housing from overhead. Conversely, one bus contact is made as a contact blade, and the other bus contact is made as the corresponding contact receiver. The bus contacts, themselves, are aligned coaxially to the longitudinal direction of the mounting rail in the housing. Here moreover, it is provided that the contact receiver of the bus contact, proceeding from the central longitudinal axis, opens outwardly toward its two longitudinal edges, while the contact blade of the bus contact becomes narrower toward its two longitudinal edges. The beveling or chamfering of the two longitudinal edges of the contact blade of the one bus contact or the opening contact receiver of the other bus contact enable reliable contacting when an electrical or electronic device is swung onto the mounting rail with adjacent devices.

In the preferred embodiment of this invention, the bus contacts are produced from a folded first strip with the formation of two legs. In doing so, one folded end of the strip forms the contact blade of one bus contact, while the other open end forms the contact receiver of the other bus contact. The circuit board connected to the bus contact via a bridge projects from a longitudinal side of one leg of the strip. To guarantee good serviceability of the contact receiver of the bus contact, on one leg of the first strip is an opening and on the other leg is a corresponding projection for fitting into the opening. In the folded-together state of the first strip, the projection is held by form-fit and/or force-fit, for example, by fitting, riveting or welding in the opening.

Other features, advantages and possible applications of this invention follow from the following description of embodiments using the drawings and the drawings themselves.

DETAILED DESCRIPTION OF THE PREFERRED EMBODIMENT

Figure 1:
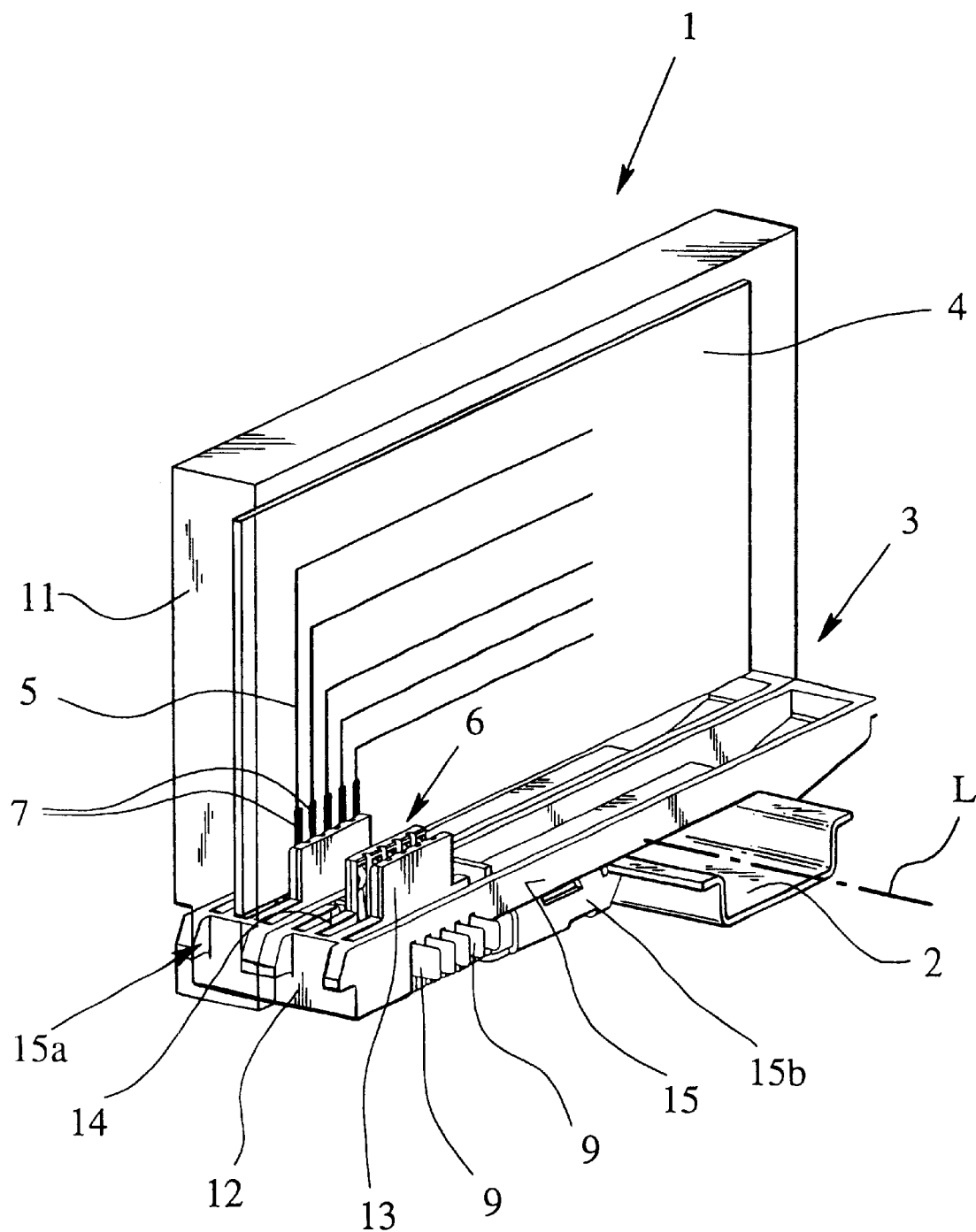
FIG. 1 is a perspective view of an electronic device in accordance with a preferred embodiment of the invention in schematic form.

FIG. 1 shows electronic device 1 for seating on mounting rail 2. Mounting rail 2 is a top hat rail. The electronic device 1, itself, has a housing 3 which is made of an insulating material, especially plastic. In housing 3 is a circuit board 4. Circuit board 4 is provided, in a conventional manner with printed conductors 5 and with electronic components which are not shown in detail and they form no part of this invention.

Furthermore, device 1 has a plurality of contact means 6. The number of contact means 6 corresponds, in this case, to the number of printed conductor connections 7. In the embodiment shown in FIG. 1, there are five contact means 6. Contact means 6 are used, on the one hand, for making contact with circuit board 4, and on the other hand, for a data and/or power bus connection with adjacent devices 1 which have corresponding contact means 6 and which are seated on mounting rail 2. As follows especially from FIG. 4, each of contact means 6 has a circuit board contact 8, front bus contact 9 and rear bus contact 10.

Electronic devices 1 of the type described above can be placed in a row on mounting rail 2 based on their design, a data and/or power bus connection being formed via respective contact means 6.

In the embodiment shown in FIG. 1, it is now such that housing 3 is made in two parts; but, it is not necessary for this to be so. Housing 3 can also be made in one part. In the embodiment shown, housing 3 has an upper part 11 which holds circuit board 4 and a base part 12 which has the contact means 6. To make contact with circuit board 4, base part 12 has a circuit board receiver 13 which projects above the top side 14 of the base part 12. In circuit board receiver 13, there are circuit board contacts 8 of individual contact means 6. Front bus contacts 9, in the installed state, project from one longitudinal side 15 of base part 12. On the opposite longitudinal side (not shown), are rear bus contacts 10.

For detachable connection of the upper part 11 to the base part 12, a catch connection 15a is used. For detachable connection of base part 12 to mounting rail 2 a detachable lock is used which takes effect when base part 12 is swung onto mounting rail 2. For this reason on base part 12, there is a spring-loaded bolt 15b which is used for fitting under mounting rail 2 on one side when base part 12 is swung onto mounting rail 2.

It should be pointed out again that the embodiment shown in FIG. 1 is simply one embodiment of the invention. In particular, it is not necessary to make the housing 3 in two parts, i.e., with the upper part 11 and base part 12.

It is significant for this invention that circuit board contact 8, front bus contact 9 and rear bus contact 10 are composed of a continuous piece of flat, electrically conductive material. This is especially apparent from FIG. 2 in which an intermediate stage of production is shown. Circuit board contact 8, in the embodiment shown, is made as a so-called tulip-shaped contact receiver. For this reason, it has two contact legs 16, 17 which open outwardly. It follows especially from FIG. 1 that the circuit board contact 8 is aligned such that circuit board 4 is located roughly transversely to longitudinal direction L of the mounting rail.

Figure 4:
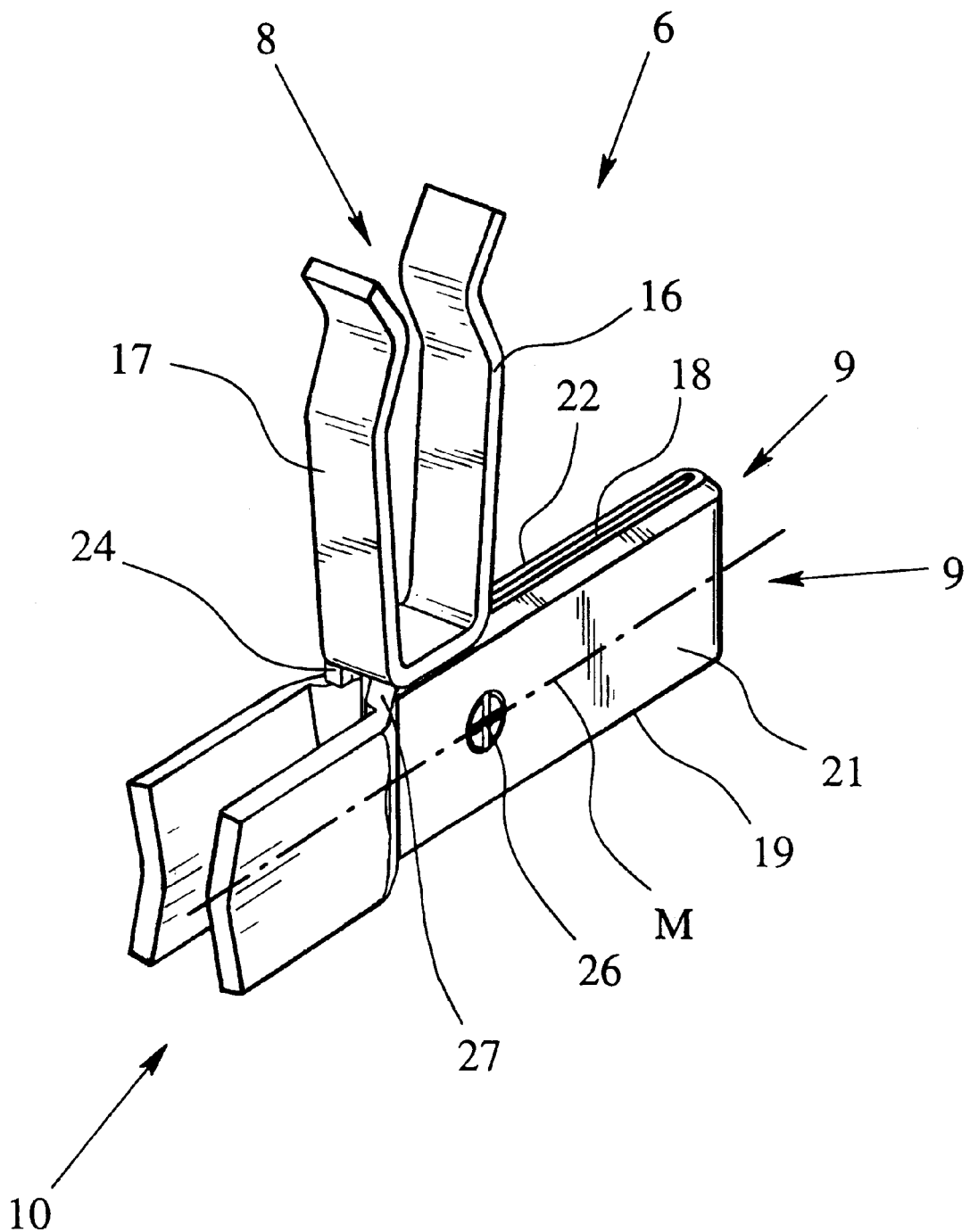
FIG. 4 is a perspective view of the contact means FIGS. 2 & 3 after completion.

As is apparent from FIG. 4, the front bus contact 9 is made in the form of a contact blade and the rear bus contact 10 in the form of a contact receiver. The bus contacts 9, 10, themselves, are aligned parallel relative to the longitudinal direction L of the mounting rail in the housing 3 or base part 12. So that front bus contact 9 of an adjacent electronic device 1 can be easily inserted into the contact receiver of rear bus contact 10, the contact is outwardly flared, proceeding from its central longitudinal axis M. Conversely, the contact blade of the front bus contact 9 becomes narrower toward its two longitudinal edges 18, 19. This also facilitates insertion or swinging of the electronic device 1 for producing a data and/or power bus connection to adjacent devices.

Figure 2:
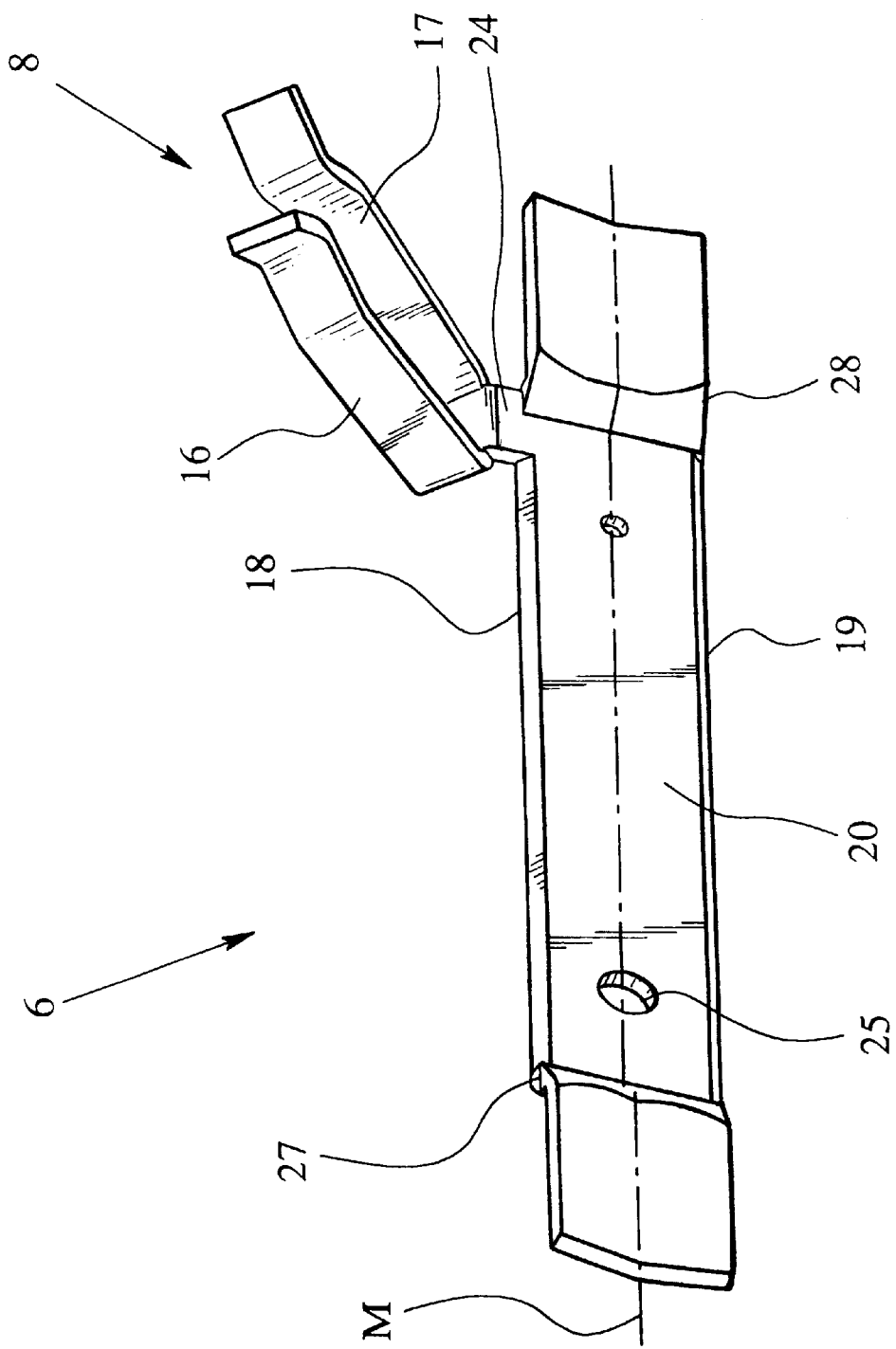
FIG. 2 is a perspective view of a contact means of the device shown in FIG. 1 in an intermediate stage of production.
Figure 3:
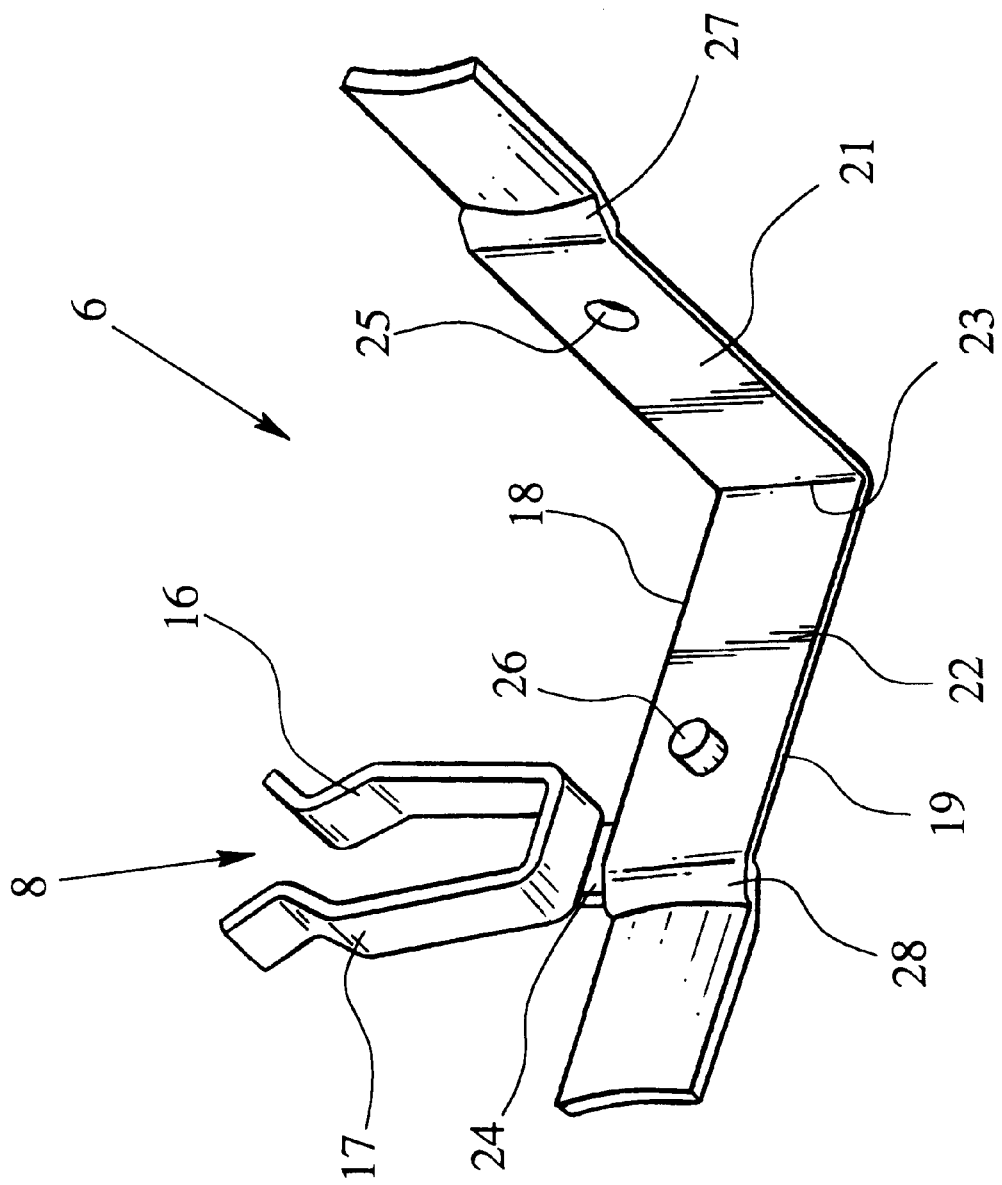
FIG. 3 is a perspective view of the contact means from FIG. 2 in an advanced stage of production.

As is especially apparent from examination of FIGS. 2, 3 and 4, bus contacts 9, 10 are produced by folding strip 20 (compare FIG. 2) with formation of two legs 21, 22. The two legs 21, 22 are separated from one another via a fold line 23. In doing so, the folded end of strip 20 forms the contact blade, i.e. front bus contact 9, while the opposite, open end of folded strip 20 forms the contact receiver of rear bus contact 10. Circuit board contact 8 is located on longitudinal edge 18 of strip 20 or leg 22. The connection to strip 20 takes placed via bridge 24 which is bent such that it is located above leg 21.

In the folded-together state shown in FIG. 4, the two legs 21, 22 are securely joined to one another. For this reason, an opening 25 is provided in leg 21, while a projection 26 is provided on other leg 22. Projection 26 can be made in one part with strip 20 or leg 22 and can be produced, for example, by deep drawing, stamping, or plunge-cutting. Here, it can also be a separate part, for example, a rivet, in which case a corresponding opening is provided in leg 22. By riveting, fitting or welding of the projection 26, there is a form-fit and/or force-fit connection in opening 25.

Production of contact means 6 now proceeds as follows. From flat metal material, a continuous piece is produced, with first strip 20 and a second strip which runs parallel thereto (from which in the subsequent production stage circuit board contact 8 is formed) is punched out, the two strips being joined to one another via bridge 24. When the two strips are punched out, the opening 25 can be also be punched, and the projection 26 can be created as well. Then, each of the ends of the first strip 20 is bent to form a step 27, 28. The two angled ends which later form the contact receiver of rear bus contact 10 are slightly angled proceeding from the central longitudinal axis M, so that, in the folded state, the above described opening of rear bus contact 10 which flares outwardly results. Then, the strip 20 can be folded in the middle so that, on the folded end of the first strip 20, the contact blade of front bus contact 9 is formed, and on the back end, the contact receiver of rear bus contact 10 is formed.

In addition, the second strip is shaped to form the circuit board contact 8 such that the "tulip shape" with two contact legs 16, 17 which flare to the outside shown in FIGS. 2–4 is produced when the strip 20 is folded. The shaping or bending of circuit board contact 8 can, otherwise, also take place before the strip 20 is folded. Furthermore, it is still necessary to angle the second strip or circuit board contact 8 over bridge 24 relative to first strip 20, roughly at a right angle to the alignment of first strip 20.

Although the bridge 24 is shown to be located at the transition to the step 28, the bridge 24 can be located elsewhere on one of the two longitudinal edges 18, 19.

Strip 20 is chamfered between the two steps 27, 28 on longitudinal edges 18, 19 so that the contact blade of front bus contact 9 becomes narrower on its two longitudinal edges 18, 19 in the folded-together state (FIG. 4).

After the two legs 21, 22 are completely folded together, the projection 26 is fitted, riveted or welded in opening 25 so that a form-fit and/or force-fit connection arises between the two legs 21, 22.

As technically possible, the specific sequence of the individual process steps is optional; this means that the aforementioned process steps, if technically possible, can also have a sequence different that described above.

While only one embodiment in accordance with the present invention has been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

I claim:

1. An electrical or electronic device for seating on a mounting rail comprising a housing with at least one circuit board located in said housing and with at least one contact means having a circuit board contact for electrical connection with the circuit board, the circuit board contact having a contact receiver with two contact legs, and having a front bus contact and a rear bus contact for making one of a data and power bus connection with adjacent devices which have corresponding contact means; wherein the circuit board contact, the front bus contact and the rear bus contact are formed as part of a single continuous piece of electrically conductive sheet material having major surfaces and relatively thin edge surfaces, said sheet material having been punched and bent to form said contacts with the major and edge surfaces of portions of the sheet material from which the contact legs of the circuit board contact are formed being oriented crosswise relative to the major and edge surfaces of portions of the sheet material from which the front and rear bus contacts are formed.

2. The device as claimed in claim 1, wherein the circuit board is located roughly transversely to a longitudinal direction of a slot for axially receiving the mounting rail.

3. The device as claimed in claim 2, wherein a first of the front and rear bus contacts is a contact blade and a second of the bus contacts is contact receiver shaped for receiving a corresponding contact blade of said adjacent devices.

4. The device as claimed in claim 3, wherein the bus contacts are aligned parallel relative to said longitudinal direction of said slot.

5. The device as claimed in claim 3, wherein the contact receiver flares outwardly from a central longitudinal axis of the contact means.

6. The device as claimed in claim 3, wherein the contact blade has outwardly tapering longitudinal edges.

7. An electrical or electronic device for seating on a mounting rail comprising a housing with at least one circuit board located in said housing and with at least one contact means having a circuit board contact for electrical connection with the circuit board, the circuit board contact having a contact receiver with two contact legs, and having a front bus contact and a rear bus contact for making one of a data and power bus connection with adjacent devices which have corresponding contact means; wherein the circuit board contact, the front bus contact and the rear bus contact are formed as part of a single continuous piece of electrically conductive material; wherein a first of the front and rear bus contacts is a contact blade and a second of the front and rear bus contacts is a contact receiver; wherein the bus contacts are on opposite ends of a strip of said electrically conductive material which is folded in a manner forming a pair of legs connected by a fold, the contact blade being formed on a folded end of the strip, and the contact receiver being formed by outwardly bent free ends of the legs; and wherein the circuit board contact projects from a longitudinal edge of one of the legs.

8. The device as claimed in claim 7, wherein an opening is provided on one of said leg and a corresponding projection for fitting into said opening is provided on the other of said legs.

9. The device as claimed in claim 8, wherein said projection is held in said opening by one of a form-fit and a force-fit connection.

* * * * *